(12) United States Patent
Bringivijayaraghavan et al.

(10) Patent No.: US 11,545,198 B2
(45) Date of Patent: *Jan. 3, 2023

(54) MULTI-SENSE AMPLIFIER BASED ACCESS TO A SINGLE PORT OF A MEMORY CELL

(71) Applicant: Marvell Asia Pte, Ltd., Singapore (SG)

(72) Inventors: Venkatraghavan Bringivijayaraghavan, Cheyyar (IN); Arjun Sankar, Horamavu Post (IN); Sreejith Chidambaran, Kerala (IN); Igor Arsovski, Williston, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/334,786

(22) Filed: May 30, 2021

(65) Prior Publication Data

US 2021/0287725 A1 Sep. 16, 2021

Related U.S. Application Data

(63) Continuation of application No. 16/655,283, filed on Oct. 17, 2019, now Pat. No. 11,024,347.

(51) Int. Cl.
*G11C 7/08* (2006.01)
*G11C 7/12* (2006.01)
*G11C 7/10* (2006.01)
*G11C 7/22* (2006.01)

(52) U.S. Cl.
CPC ............... *G11C 7/12* (2013.01); *G11C 7/08* (2013.01); *G11C 7/1075* (2013.01); *G11C 7/22* (2013.01)

(58) Field of Classification Search
CPC ........... G11C 7/12; G11C 7/08; G11C 7/1075; G11C 7/22; G11C 7/1042; G11C 2207/2281; G11C 2207/229; G11C 7/1066; G11C 7/1093; G11C 7/222; G11C 11/419; G11C 7/1012; G11C 7/1069; G11C 7/1096
See application file for complete search history.

(56) References Cited

U.S. PATENT DOCUMENTS

| | | |
|---|---|---|
| 5,204,841 A | 4/1993 | Chappell et al. |
| 6,259,648 B1 | 7/2001 | Kragick |
| 6,882,562 B2 | 4/2005 | Beucler |
| 7,057,965 B2 | 6/2006 | Tobescu et al. |
| 7,307,912 B1 | 12/2007 | Vernenker et al. |
| 8,374,050 B2 | 2/2013 | Zhou et al. |
| 9,953,701 B1 | 4/2018 | Bohra et al. |

(Continued)

*Primary Examiner* — Jay W. Radke (57) ABSTRACT

A memory device includes a memory array of memory cells, wordlines and bitlines connected to the memory cells, a first read multiplexor and a second read multiplexor connected to the bitlines, a first sense amplifier connected to the first read multiplexor, a second sense amplifier connected to the second read multiplexor, a first data path connected to the first sense amplifier, and a second data path connected to the second sense amplifier. Each of the memory cells is connected to only one pair of the bitlines and only one of the wordlines. The first read multiplexor is adapted to connect the first sense amplifier to the bitlines during a first portion of a clock cycle and the second read multiplexor is adapted to connect the second sense amplifier to the bitlines during a second portion of a clock cycle that is different from the first portion of the clock cycle.

20 Claims, 5 Drawing Sheets

(56) References Cited

U.S. PATENT DOCUMENTS

| | | |
|---|---|---|
| 10,061,542 B2 | 8/2018 | Kwok et al. |
| 2007/0109909 A1 | 5/2007 | Jung |
| 2018/0122446 A1 | 5/2018 | Berger et al. |
| 2019/0115056 A1 | 4/2019 | Cheng et al. |
| 2020/0027501 A1 | 1/2020 | Chen et al. |
| 2021/0327500 A1* | 10/2021 | Kuo ..................... G11C 11/419 |

* cited by examiner

Figure 6 ical circuit (IC) chip, there have been various proposed memory architectures which employ single-port memory cells, often referred to as single port read/write (1RW) memories.

MULTI-SENSE AMPLIFIER BASED ACCESS TO A SINGLE PORT OF A MEMORY CELL

CROSS-REFERENCE TO RELATED APPLICATIONS

The present disclosure is a continuation of U.S. patent application Ser. No. 16/655,283 filed on Jun. 1, 2021. The entire disclosure of the application referenced above is incorporated herein by reference.

BACKGROUND

Field of the Invention

The present disclosure relates to electronic memory arrays, and more specifically, to multi-port input/outputs of such memory arrays.

Description of Related Art

Electronic memories come in different forms including dynamic random access memory (DRAM) arrays, static random access memory (SRAM) arrays, read-only memory (ROM) arrays, embedded DRAM (eDRAM) arrays, magnetic random access memory (MRAM) arrays, flash arrays, etc. The data in SRAMs is retained as long as power remains applied, unlike DRAMs that need to be periodically refreshed.

Conventional SRAMs perform one operation, either a read operation or a write operation, in one clock cycle. An SRAM receives one set of addresses and performs a first level, global predecode. Then, the predecoding lines within the SRAM distribute the predecode signals according to a decoding map. A second level decoding is performed locally on the predecoding signals to select a specific memory location. The read operation or the write operation is selected via a control pin. If the read operation is selected, then the data is read from the specific memory location via a data output pin (Q). If the write operation is selected, then the data is written into the specific memory location via a data input pin (D).

Multi-port memories are used in electronic applications for high-speed data transfer such as, buffering, video processing, communications, etc. Multi-port memory is distinguished from single-port memory by the ability to simultaneously read data from and write data to memory cells within a single clock cycle. With true multi-port memories, reading can occur on one port simultaneously while writing occurs on another port. Hence, each port provides a separate independent read and write access path for reading/writing data from/to the memory. One type of two-port memory (1R1W) has a dedicated read port and a dedicated write port, which allows a single read operation and a single write operation to be performed in a single clock cycle.

Multi-port memory is typically implemented using static random access memory (SRAM). In a conventional single-port architecture, each bit in an SRAM cell is stored on four transistors that form two cross-coupled inverters operative as a storage element of the memory cell. Two additional transistors serve to control access to the storage element during read and write operations. A typical SRAM cell uses six transistors and is thus often referred to as a 6T SRAM. In a multi-port architecture, two additional access transistors are generally used for each additional port; hence two-port functionality would be provided by an eight-transistor (8T) SRAM, three-port functionality would be provided by a ten-transistor (10T) SRAM, and so on. However, because implementing a true monolithic multi-port memory can consume a significant amount of area and power on an integrated circuit (IC) chip, there have been various proposed memory architectures which employ single-port memory cells, often referred to as single port read/write (1RW) memories.

In one known approach, often referred to as double-pumping, time-domain multiplexing of the memory clock is utilized. Using this approach, pseudo dual port memory functionality is achieved using single-port memory cells, with half of the memory clock cycle being dedicated to read operations and the other half being dedicated to write operations.

In pseudo dual port memory operation, a memory device receives a read address and a write address consecutively in one cycle to generate a dual operation decoding signal. The read signal pulse can be triggered by the rising edge of the external clock signal. The read pulse width is determined by the time necessary to perform a corresponding read operation. A write signal pulse can be correspondingly triggered by the falling edge of the read pulse. The write pulse width is determined by the time necessary to perform a corresponding write operation. The clock generating circuit can add a gap time between each consecutive read pulse and write pulse to prevent overlap. The read self-timed clock signal is used to subsequently generate a read decoding signal, where the read decoding signal corresponds to a read operation to be performed on a designated memory address. The write self-timed clock signal is used to subsequently generate a write decoding signal, where the write decoding signal corresponds to a write operation to be performed on a designated memory address. The read signal pulse is longer than the write signal pulse, and hence results in lower performance for read followed by read.

By time-domain multiplexing the clock in this manner, conflicts between read and write accesses during a given memory cycle can be avoided. Although a savings in chip area can be achieved using this approach, the data path is now narrower and has less bandwidth compared to an implementation using true two-port memory cells, and thus the memory system must, overall, be slower.

Another approach is to divide the dual-port memory into banks of single-port memory cells. Provided there are no bank conflicts (i.e., the read address and the write address do not require accessing the same single-port memory bank during the same memory cycle), the memory can theoretically run at the maximum frequency of the single-port memory cells. When a bank conflict does arise however, a pipeline stall will typically occur, resulting in a latency penalty and the need for complex arbitration or control logic outside of the memory.

SUMMARY

Memory devices herein can include (among other components) a memory array of memory cells (e.g., single port memory cells), wordlines, pairs of complementary bitlines connected to the memory cells, etc. Note that, because the memory cells are single port memory cells, each of the memory cells is connected to only one of the pairs of complementary bitlines and only one of the wordlines. Various multiplexors are also connected to the memory cells including: a first read multiplexor; a second read multiplexor; a write multiplexor, etc.

These structures include multiple sense amplifiers. For example, a first sense amplifier can be connected to one of the pairs of complementary bitlines through the first read multiplexor, a second sense amplifier can also be connected to same or different pairs of complementary bitlines through the second read multiplexor, etc. Further, multiple data paths are included in such structures. Thus, a first data path can be connected to the first sense amplifier, and a second data path can be connected to the second sense amplifier. Also, a write driver can be connected to the pairs of complementary bitlines through the write multiplexor, and correspondingly a write global data path is connected to the write driver. The write multiplexor is adapted to connect the write driver to the bitlines alternately with the second read multiplexor connecting the second sense amplifier to the bitlines.

The first read multiplexor and the second read multiplexor are adapted to provide two separate read ports that can be used in a single clock cycle, where the first read multiplexor connects the first sense amplifier to the bitlines during a first portion of the clock cycle and the second read multiplexor connects the second sense amplifier to the bitlines during a second portion of the clock cycle. The second sense amplifier is adapted to be enabled simultaneously while the first sense amplifier is performing a read operation and vice versa. Thus, the first sense amplifier and the second sense amplifier are adapted to perform consecutive read operations from the memory array during each clock cycle (or a read operation and a write operation can be performed during each clock cycle using the write multiplexor and write driver).

This disclosure also presents methods of controlling such a memory device. These methods can include various steps, including connecting the first sense amplifier to a pair of complementary bitlines in the memory array during the first portion of the clock cycle using the first read multiplexor. Such methods perform a first read operation using the first sense amplifier during the first portion of the clock cycle while the first sense amplifier is connected to the bitline pair. These methods also reset the second sense amplifier during the first portion of the clock cycle (if running at max speed).

Then, at the end of the first portion of the clock cycle, these methods disconnect the first sense amplifier from the bitlines and connect the second sense amplifier to the same or a different pair of the complementary bitlines in the memory array during the second portion of the clock cycle using the second read multiplexor. This allows these methods to perform a second read operation during the second portion of the clock cycle using the second sense amplifier while the second sense amplifier is connected to the second bitline pair. Such methods also reset the first sense amplifier during the second portion of the clock cycle. Thus, the first sense amplifier and the second sense amplifier are adapted to perform consecutive read operations from the memory array during each clock cycle.

In addition, these methods can connect a pair of the complementary bitlines to the write driver using the write multiplexor. More specifically, the write multiplexor connects the write driver to the bitlines during the second portion of the clock cycle as an alternative to the second read multiplexor connecting the second sense amplifier to the bitlines. This allows these methods to perform a write operation using the write driver during the second portion of the clock cycle while the write driver is connected to the bitline pair.

BRIEF DESCRIPTION OF THE DRAWINGS

The embodiments herein will be better understood from the following detailed description with reference to the drawings, which are not necessarily drawn to scale and in which.

DETAILED DESCRIPTION

As noted above, two-port memory functionality can be achieved using single-port memory cells by performing time-domain multiplexing where a portion of the memory clock cycle is dedicated to read operations and the other portion is dedicated to write operations. This is sometimes referred to as a "pseudo dual port" memory because the single port memory cell is time-domain multiplexed to act as if it were a two-port memory cell.

The sense amplifier and read data path used in the read operation are reset after the read operation is complete and this reset (re-cycle) process consumes some of the dock cycle. Therefore, performing a write operation (using a write driver and write data path) while the sense amplifier and read data path are resetting may not consume significant amounts of the dock cycle. This is especially true because the read and write multiplexors isolate the read data path and write data path. However, while the time penalty for performing both the read and write operations in a single clock cycle may not be significant, attempting to perform two read operations in a single clock signal slows operating speed unacceptably because the second read operation is longer than the write operation, and cannot be performed until the sense amplifier and read data path are reset.

More specifically, single port memory cells only include a single read multiplexor, single sense amplifier, and single read global data path. Thus, when performing two read operations in the same clock cycle (e.g., pseudo dual port or time division multiplexing) the single sense amplifier of a single port memory cell must reset between subsequent reads. The time needed to reset the single sense amplifier when combined with the time needed to perform two read operations (e.g., switch the single multiplexer, transmit data along the single data path, etc.) creates an unacceptably long delay for a single clock cycle. Again, in contrast when a read operation is followed by a write operation in the same cycle with a single port memory cell (again using a pseudo dual port or time division multiplexing), the single read multiplexor, sense amplifier, and data path can reset while the write driver is writing to the memory cell keeping the clock cycle within an acceptable range.

In view of such issues, this disclosure presents a pseudo dual port I/O circuit that includes multiple sets of read circuit elements (each with its own multiplexer, sense amplifier, and read global data path) to allow multiple read operations to be performed in a single clock cycle without unacceptable long delay. Thus, with the structures and methods herein, the bitlines are connected to multiple sense amplifiers with each of having their own global data path. The sense amplifier selection is based on the port selection.

Therefore, these structures and methods support pseudo dual-port functions of read followed by read or write, where the first read operation happens in the first portion of the clock cycle through a first read path having one read bitswitch (multiplexor), sense amplifier, and read global data path. Additionally, a write operation or a second read operation can occur in the second portion of the clock cycle. The second read operation uses a second read path having a second read bitswitch (multiplexor), sense amplifier, and read global data path. The second read operation path can be activated through selective control signal design. Usage of the additional read path speeds up the "read followed by read or write" functionality (e.g., 1R1RW) by avoiding waiting to re-cycle a single sense amplifier. This architecture works with any number of banks and with multi-port cells. In other words, these structures and methods provide a Q (read) port dependent sensing process where the bitlines are connected to multiple sense amplifiers, with each sense amplifier having a dedicated global data path, and where the sense amplifier and global data path selection is based on the output Q port selection.

Figure 1:
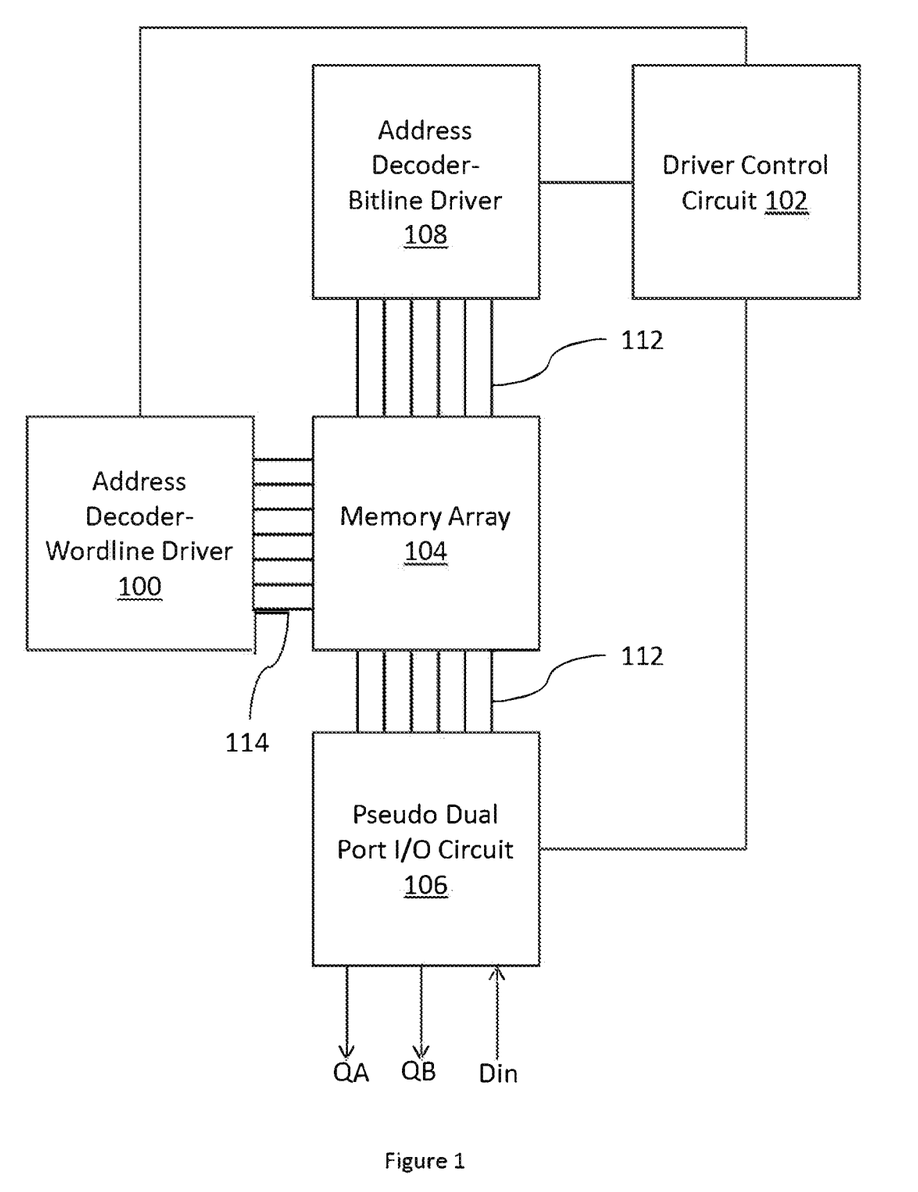
FIG. 1 is a schematic diagram illustrating a memory device according to embodiments herein.

As shown in FIG. 1, memory devices herein can include (among other components) a wordline driver circuit 100, a driver control circuit 102, a memory array 104, a pseudo dual port I/O circuit 106 (having output ports QA and Oft and input port Din), a bitline driver circuit 108, etc. Note that the components shown could include additional sub-components and some components shown separately could be combined together, and the devices/circuits shown are presented conceptually and not in full detail for ease of understanding the operation of devices and methods herein.

Further, such memory devices include electrically conductive bitlines 112 forming columns within the memory array 104 and connecting the memory array 104 to the bitline driver circuit 108 and the pseudo dual port I/O circuit 106, and wordlines 114 forming rows in the memory array 104 and connecting the memory array 104 to the wordline driver circuit 100. In one example, the driver control circuit 102 can control the wordline driver circuit 100, the bitline driver circuit 108, and the pseudo dual port I/O circuit 106 to perform read operations from the cells in the memory array 104, write operations to the cells in the memory array 104, etc.

Figure 2:
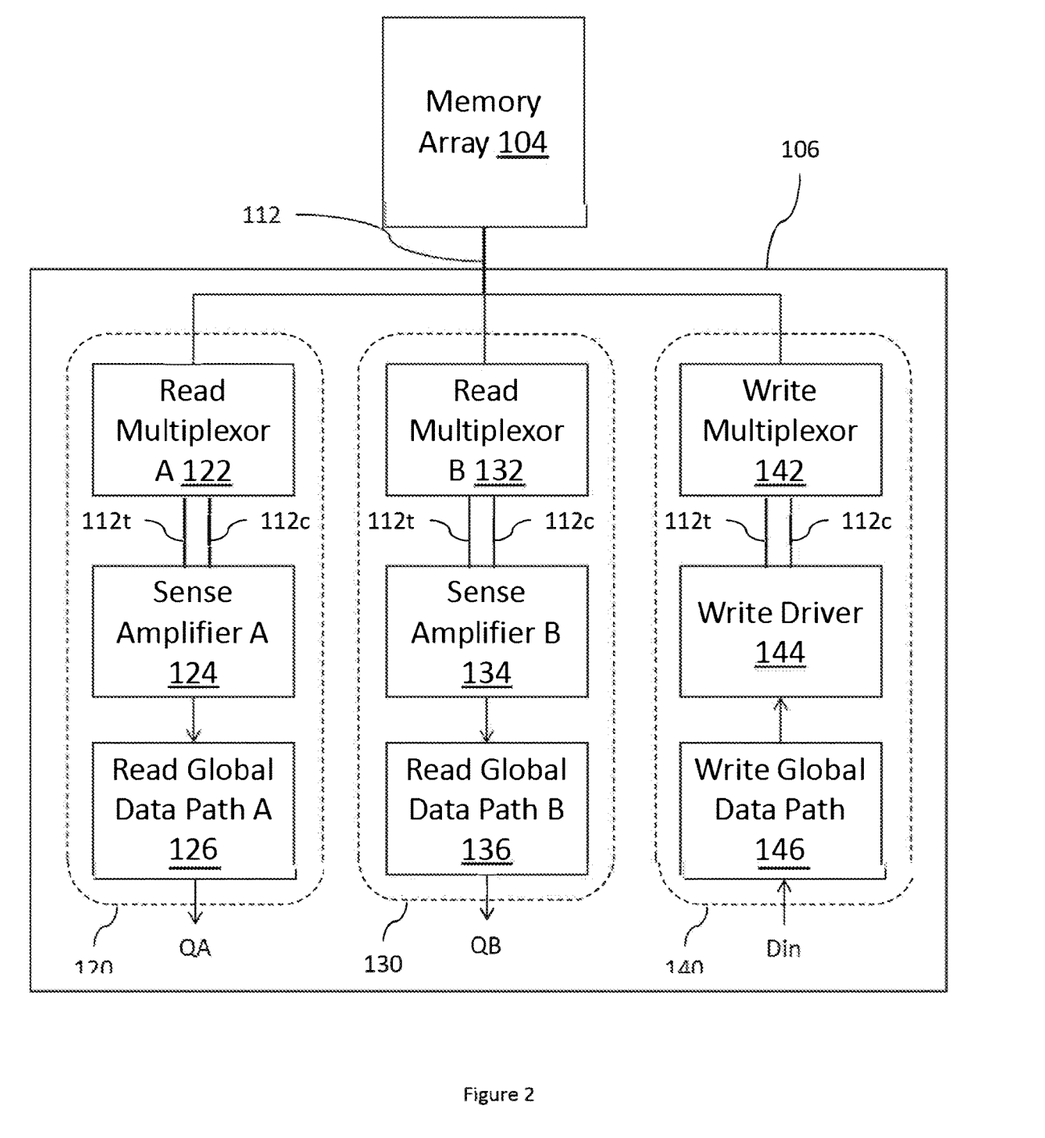
FIG. 2 is a schematic diagram illustrating a pseudo dual port I/O circuit according to embodiments herein.

FIG. 2 illustrates the memory array 104 and the pseudo dual port I/O circuit 106 in greater detail. As shown, the pseudo dual port I/O circuit 106 includes first read circuit elements 120, second read circuit elements 130, and write circuit elements 140. Briefly referring to FIG. 3, some components of the memory array 104 are illustrated, including memory cells 110 connected to the decoders/drivers 100, 108 by wordlines (WL) and bitlines (BL).

Figure 3:
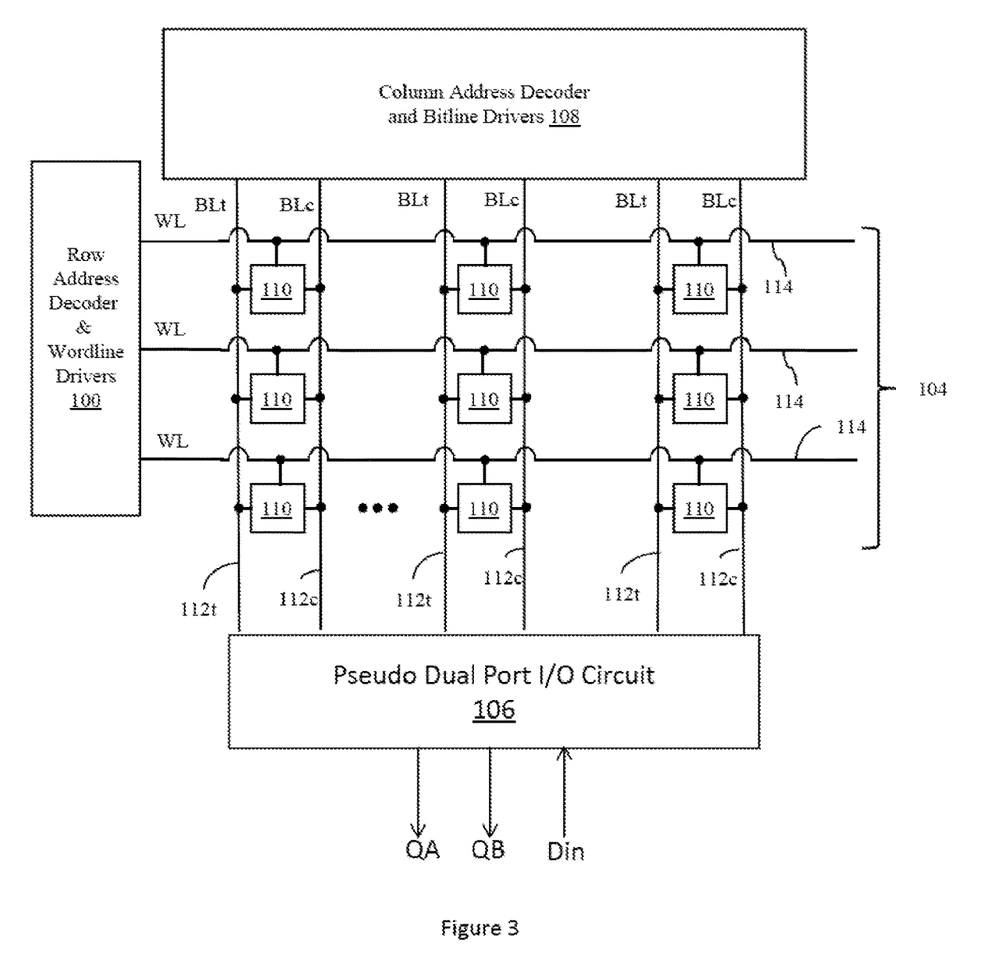
FIG. 3 is a schematic diagram illustrating a memory array according to embodiments herein.

More specifically the bitlines are shown to include true bitlines 112*t* and complement bitlines 112*c*; however, other types of memory arrays may utilize only a single bitline per memory cell 110. Further, the true 112*t* and complement 112*c* bitlines are connected to the pseudo dual port I/O circuit 106. Note that single port memory cells are distinguished from true multi-port memory cells by at least their connections to the bitlines. In single port memory cells (e.g., 6T) only one bitline (or only one pair of complementary bitlines) is connected to each memory cell, while in contrast each true multi-port memory cell (e.g., 8T, 10T, etc.) is connected to multiple different bitlines (or multiple different pairs of complementary bitlines) because the multiple bitlines (or multiple pairs of bitlines) provide the multiple ports.

Note that the drawings only show three multiplexors 122, 132, 142 connected to the memory array 104; however, this is not the only arrangements herein and is provided only to avoid excessive clutter in the drawings. While some implementations may use only three multiplexors 122, 132, 142 for the entire memory array (where each multiplexor is individually connected to each column in the memory array 104), other implementations may use multiple sets of the three multiplexors 122, 132, 142 per memory array 104. For example, a single set of three multiplexors 122, 132, 142 may be used per column of cells (e.g., one set of three multiplexors 122, 132, 142 is connected to each bitline 112 or bitline pair 112*t*, 112*c*), or a single set of three multiplexors 122, 132, 142 may be connected to each of many groups or banks of the columns. Additionally, only two sense amplifiers 124, 134 and a single write driver 144 may be used for the entire memory array 104, or individual sets of sense amplifiers 124, 134 and write driver 144 may be used for each column or column group/bank in the memory array 104.

Therefore, the compact and uncluttered illustration of a single set of three multiplexors 122, 132, 142 is intended to represent one set as well as multiple sets of multiplexors, and similarly the illustrated single set of sense amplifiers 124, 134 and write driver 144 is intended to represent one set as well as multiple sets. Such compact illustrations are utilized because illustration of all possible permutations and combinations would be cumulative, cumbersome, and distract the reader from the salient features and unique operation of the pseudo dual port I/O circuit 106 described herein. Thus, these structures can utilize as many multiplexors as desired so that one sense amplifier is used in one portion of the clock cycle and another sense amplifier is used in another portion of the clock cycle to thereby allow the non-used sense amplifier to reset, and thus provide a pseudo dual port operation from single-port memory cells.

Referring again to FIG. 2, various multiplexors within the circuit elements 120, 130, and 140 connect to the memory cells 110 in the memory array 104 through the bitlines 112 including: a first read multiplexor A 122; a second read multiplexor B 132; and a write multiplexor 142. With these structures the first sense amplifier 124 is connected to the pairs of complementary bitlines 112*t*, 112*c* through the first read multiplexor 122, the second sense amplifier 134 is connected to the pairs of complementary bitlines 112*t*, 112*c* through the second read multiplexor 132, and the write driver 144 is connected to the pairs of complementary bitlines 112*t*, 112*c* through the write multiplexor 142, etc.

At any given time, only one of the multiplexors 122, 132, 142 connects to the bitlines, and each of the multiplexors 122, 132, 142 only forms a connection to a single pair of complementary bitlines during any one time period. More specifically, in the first read circuit elements 120, the first read multiplexor 122 selectively connects a first sense amplifier A 124 to only one specific pair of the bitlines 112*t*, 112*c*; in the second read circuit elements 130, the second read multiplexor 132 selectively connects a second sense amplifier B 134 to only one specific pair of the bitlines 112*t*, 112*c*; and in the write circuit elements 140, the write multiplexor 142 selectively connects a write driver 144 to only one specific pair of the bitlines 112*t*, 112*c*. Therefore, at any given time only one of the multiplexors 122, 132, 142 selectively connects to only one of the columns of memory cells 110 within the memory array 104.

The sense amplifier selection is based on the port selection. Therefore, if the read instruction is to read from port QA, the first read multiplexor A 122 will be connected to a pair of bitlines 112*t*, 112*c*. Alternatively, if the read instruction is to read from port Oft the second read multiplexor B 132 will be connected to a pair of bitlines 112*t*, 112*c*.

Additionally, FIG. 2 illustrates two read global data paths 126, 136 and a write global data path 146. Thus, the first read global data path 126 is connected to the first sense amplifier 124, the second read global data path 136 is connected to the second sense amplifier 134, the write global data path 146 is connected to the write driver 144. Specifically, the first sense amplifier 124 outputs QA to the first read global data path A 126, the second sense amplifier 134 outputs QB to the second read global data path B 136, and the write driver 144 receives input Din from the write global data path 146.

With such structures, the first read multiplexor 122 and the second read multiplexor 132 are adapted to provide two separate read ports (QA, QB) that can be used sequentially in different portions of the same clock cycle to perform two read operations without significant time penalty. Thus, the first sense amplifier 124 within the first read circuit elements 120 and the second sense amplifier 134 within the second read circuit elements 130 are adapted to perform separate, non-overlapping read operations from the memory array 104 during first and second portions of each clock cycle. Alternatively, rather than performing two read operations in one clock cycle, either the first read circuit elements 120 or the second read circuit elements 130 can perform a read operation in a first portion of a clock cycle and subsequently a write operation can be performed by the write circuit elements 140 in the second portion of the clock cycle.

The memory array 104 is an undivided grouping of the memory cells 110 that can only activate a single address (single wordline and single bitline pair (or single bitline)) at a time. In other words, the structure of the memory array 104 is such that only a single memory address (single memory cell 110 at a single intersection of wordline and bitlines) may be accessed at one point in time. Because the memory array 104 is undivided, simultaneous activation of more than one wordline or bitline pair would cause a memory address conflict. Therefore, the memory array 104 can be a full array that is not partitioned into sub-arrays, or the memory array 104 can be an undivided sub-array (a sub-array that is not further partitioned or sub-divided). Because of this structure of the memory array 104 and the single port structure of the memory cells 110, the multiple read operations from ports QA and QB are performed sequentially in a single clock cycle to avoid address conflicts.

Note that any one of the memory cells 110 in the memory array 104 can be read from or written to during any read or write operation (based on different wordline and bitline activation defining a single address within the memory array 104). Therefore, two different memory cells 110 could be read from (or different memory cells 110 could be read from and written to) in a given clock cycle, or the same memory cell 110 could be read from twice (or read from and written to) in a given clock cycle. Additionally, if the memory array 104 is part of a larger array that has been partitioned into sub-arrays, such multiple sequential reading/writing in a single clock cycle could occur simultaneously in different sub-arrays.

When performing two read operations in the same clock cycle, the elapsed time is reduced because the second sense amplifier 134 and second read global data path 136 are adapted to be enabled simultaneously while the first circuit elements 120 are performing a read operation in the first part of the clock cycle. Similarly, the first sense amplifier 124 and first read global data path 126 are adapted to reset simultaneously while the second circuit elements 130 are performing a read operation in the second part of the clock cycle.

Figure 4:
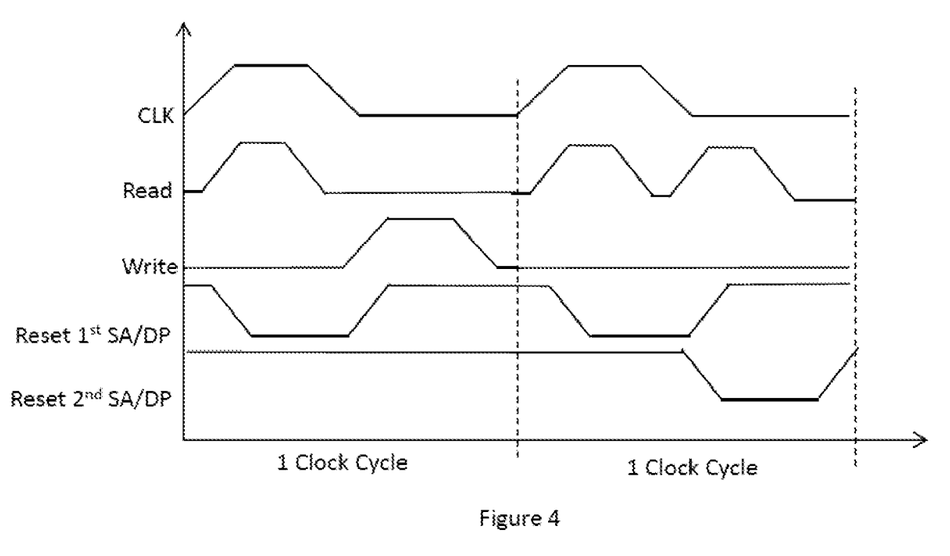
FIG. 4 is a timing diagram illustrating operations of embodiments herein.

This is shown in the timing diagram in FIG. 4 where the top line shows the periodic regular pulses of the clock signal (CLK) and the vertical broken line shows the boundaries of each clock cycle. The second line from the top in FIG. 4 shows a single read operation (READ) occurring in the first portion of the first clock cycle and two read operations occurring in the first and second portions of the second clock cycle. The third line from the top in FIG. 4 shows a single write operation (WRITE) occurring in the second portion of the first clock cycle and no write operations occurring in the second clock cycle.

The fourth line in FIG. 4 shows timing of application of various voltages and signals used to enable or reset the first circuit elements 120, such as the first sense amplifier 124 and first read global data path 126 (Reset $1^{st}$ SA/DP). The fifth line in FIG. 4 shows timing of application of various voltages and signals used to enable or reset the second circuit elements 130, such as the second sense amplifier 134 and second read global data path 136 (Reset $2^{nd}$ SA/DP). This shows that the second sense amplifier 134 and second read global data path 136 are adapted to be enabled simultaneously while the first circuit elements 120 are performing a read operation in the first part of a clock cycle. Similarly, the first sense amplifier 124 and first read global data path 126 are adapted to reset simultaneously while the second circuit elements 130 are performing a read operation in the second part of the clock cycle.

Figure 5:
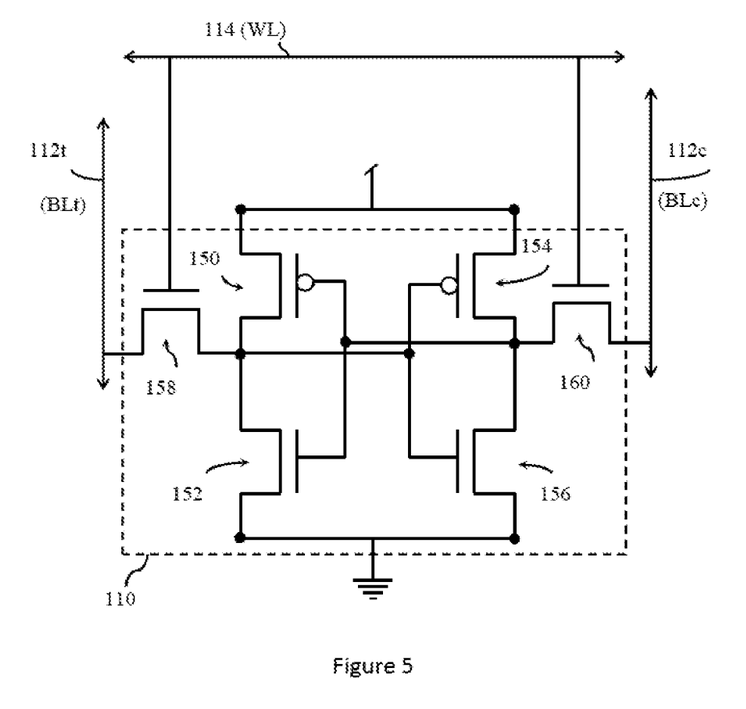
FIG. 5 is a schematic diagram illustrating a memory cell according to embodiments herein.

FIG. 5 illustrates one type of memory cell 110 (e.g., SRAM); however, the memory cells 110 within the memory array 104 could comprise any form of memory cell (e.g., DRAM, ROM, eDRAM, MRAM, Flash, etc.) whether currently known or developed in the future. Within the SRAM structure shown in FIG. 5, each bit of data is stored on four transistors (150, 152, 154, 156) that form two cross-coupled inverters (150-152 and 154-156). Such a memory cell 110 has two stable states which are used to denote a logic 0 and a logic 1. Two additional access transistors (158, 160) serve to control the access to the memory cell 110 during read and write operations. As such, it typically takes six transistors (6T) to store one memory bit. Access to each memory cell is enabled by the wordline 114, which controls the two access transistors 158, 160. The two N-type access transistors 158, 160 control whether the memory cell is connected to one or both bit lines 112*t*, 112C, which are used to transfer data during both read and write operations.

Three different operations are possible: standby, read, and write. For the standby operation, if the wordline 114 is not high, the two N-type access transistors 158, 160 disconnect the memory cell 110 from the bitlines 112*t*, 112*c*, and the two cross coupled inverters (150-152 and 154-156) continue to reinforce each other as long as they are disconnected from the bit lines 112*t*, 112*c* and are supplied power.

A read operation is performed by pre-charging both the bitlines 112*t*, 112*c* to a logical 1, then making the wordline 114 high, thereby enabling both the access transistors 158, 160. Then, the data stored in the two cross-coupled inverters (150-152 and 154-156) is transferred to the bitlines 112*t*, 112*c*. A write operation is initiated by applying the data value to be written to the bitlines 112*t*, 112*c*. The wordline 114 is then made high and the data value that is to be stored is latched by the two cross-coupled inverters (150-152 and 154-156). The bitline input drivers 108 are designed to be much stronger than the relatively weak transistors (150, 152, 154, 156) in the memory cell itself, so that the previous state of the cross-coupled inverters (150-152 and 154-156) is easily overwritten.

Figure 6:
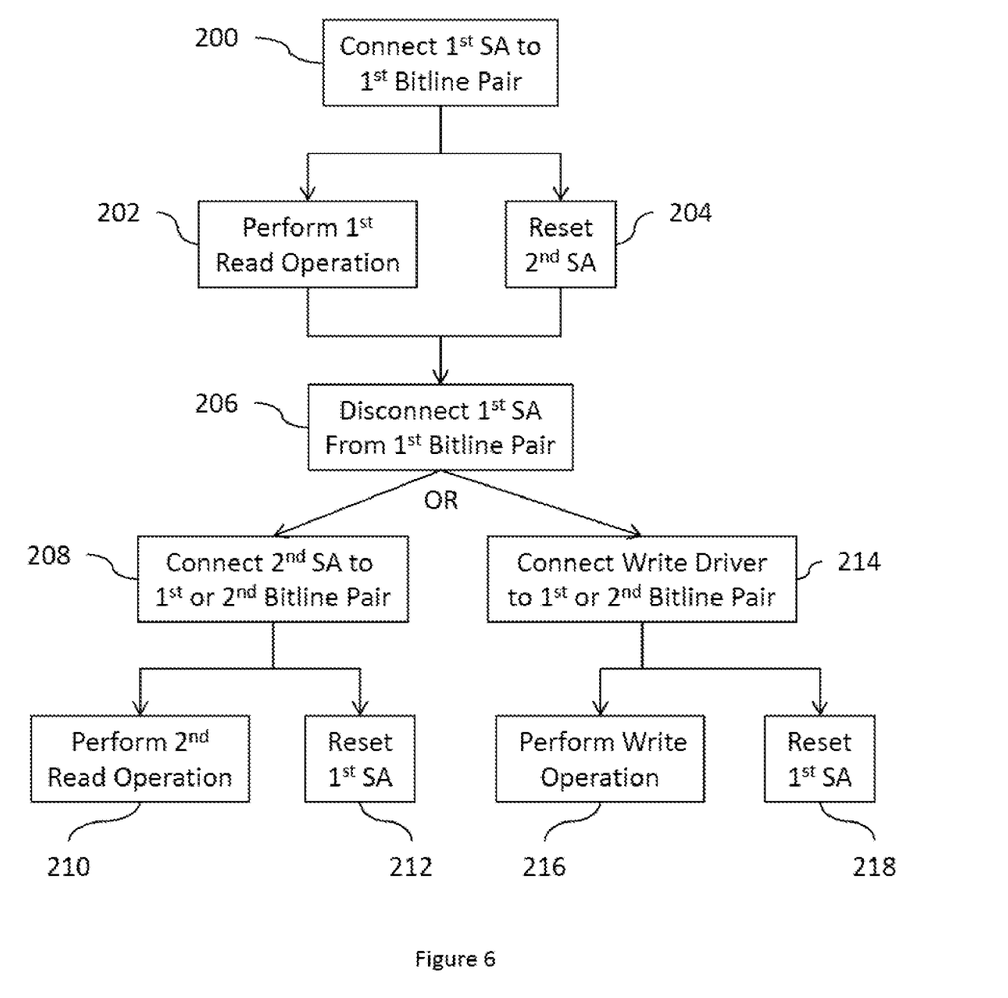
FIG. 6 is a flow diagram illustrating embodiments herein.

As shown in the flowchart in FIG. 6, this disclosure also presents methods of controlling such a memory device using a read/write control circuit to perform either two reads or a read and a write in a single clock cycle. These methods can perform various steps, including connecting the first sense amplifier to a pair of the bitlines in the memory array during a first portion of a clock cycle using the first read multiplexor in item 200. Such methods perform a first read operation during the first portion of the clock cycle using the first sense amplifier while the first sense amplifier is connected to the bitline pair in item 202. These methods can also enable the second sense amplifier during the first portion of the clock cycle in item 204 if needed. Then, at the end of the first portion of the clock cycle, these methods disconnect the first sense amplifier from the bitline pair in item 206.

At this point, the methods can perform either another read operation (208, 210, 212) or a write operation (214, 216, 218). Therefore, when performing another read operation, these methods connect the second sense amplifier to a pair of the bitlines in the memory array during a second portion of the clock cycle using the second read multiplexor in item 208. This allows these methods to perform a second read operation during the second portion of the clock cycle using the second sense amplifier in item 210 while the second sense amplifier is connected to the second bitline pair. In item 212, such methods also reset the first sense amplifier during the second portion of the clock cycle, in necessary. Thus, the first sense amplifier and the second sense amplifier are adapted to perform consecutive read operations from the memory array during each clock cycle.

When performing a write operation instead of the second read operation, in item 214 these methods can connect a bitline pair to a write driver during the second portion of the clock cycle using a write multiplexor. Again, the write multiplexor connects the write driver to the bitline pair alternately with the second read multiplexor connecting the second sense amplifier to the bitline pair in item 208. This allows these methods to perform a write operation during the second portion of the clock cycle using the write driver while the write driver is connected to the bitline pair in item 216 and reset the first sense amplifier during the second portion of the clock cycle in item 218.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" (denoted with a circle in the drawings) uses impurities such as boron, aluminum or gallium, etc., within an intrinsic semiconductor substrate (to create deficiencies of valence electrons) as a semiconductor region. Similarly, an "N-type transistor" (lacking a circle) is a negative-type transistor that uses impurities such as antimony, arsenic or phosphorous, etc., within an intrinsic semiconductor substrate (to create excessive valence electrons) as a semiconductor region.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements).

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections, or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A memory circuit comprising:
    a memory array comprising a memory cell, the memory cell including a single port;
    a first sense amplifier configured to perform a first read operation including sensing a state of the memory cell via the single port during a first portion of a first dock cycle, and configured to not perform a read operation that includes sensing the state of the memory cell via the single port during a second portion of the first dock cycle; and
    a second sense amplifier configured to not perform a read operation that includes sensing the state of the memory cell via the single port during the first portion of the first dock cycle, and configured to perform a second read operation including sensing the state of the memory cell via the single port during the second portion of the first dock cycle.

2. The memory circuit of claim 1, further comprising a drive circuit configured:
    during the first portion of the first clock cycle, to enable the second sense amplifier for the second read operation while the first sense amplifier performs the first read operation; and
    during the second portion of the first clock cycle, to not perform enable operations that includes enabling the second sense amplifier.

3. The memory circuit of claim 1, further comprising a drive circuit configured:
    during the first portion of the first clock cycle, to not reset the first sense amplifier; and
    during the second portion of the first clock cycle, to reset the first sense amplifier while the second sense amplifier performs the second read operation.

4. The memory circuit of claim 1, further comprising a third sense amplifier configured, during a portion of a second clock cycle, to perform a write operation including changing the state of the memory cell via the single port.

5. The memory circuit of claim 4, wherein one of the first sense amplifier and the second sense amplifier is configured:
    during the portion of the second clock cycle, not to perform a read operation that includes sensing the state of the memory cell via the single port; and
    during another portion of the second clock cycle, to perform a third read operation including sensing the state of the memory cell via the single port.

6. The memory circuit of claim 1, further comprising:
    a first multiplexor configured to connect the first sense amplifier to the single port during the first portion of the first clock cycle; and
    a second multiplexor configured to connect the second sense amplifier to the single port during the second portion of the first clock cycle.

7. The memory circuit of claim 6, wherein:
    the second multiplexor is configured to not connect the second sense amplifier to the single port during the first portion of the first clock cycle; and
    the first multiplexor is configured to disconnect the first sense amplifier from the single port during the second portion of the first clock cycle.

8. The memory circuit of claim 1, further comprising:
    a first multiplexor configured to connect the first sense amplifier to the single port during the first portion of the first clock cycle;
    a second multiplexor configured to connect the second sense amplifier to the single port during the second portion of the first clock cycle;
    a third sense amplifier; and
    a third multiplexor configured, during a first portion of a second clock cycle, to connect the third sense amplifier to the single port,
    wherein the third sense amplifier is configured, during a second portion of the second clock cycle, to perform a write operation including changing the state of the memory cell via the single port.

9. The memory circuit of claim 1, wherein the first sense amplifier is configured to perform consecutive read operations during a second clock cycle.

10. The memory circuit of claim 1, further comprising a drive circuit configured to:

generate a first read puke to perform the first read operation, the first read puke is triggered by a rising edge of the first clock cycle; and generate a second read puke to perform the second read operation, the second read pulse is triggered by a falling edge of the first read puke.

11. A method of operating a memory circuit comprising a memory cell, the memory cell comprising a single port, the method comprising:

performing a first read operation via a first sense amplifier including sensing a state of the memory cell via the single port during a first portion of a first clock cycle;

not performing a read operation via the first sense amplifier that includes sensing the state of the memory cell via the single port during a second portion of the first clock cycle;

not performing a read operation via a second sense amplifier that includes sensing the state of the memory cell via the single port during the first portion of the first clock cycle; and performing a second read operation via the second sense amplifier including sensing the state of the memory cell via the single port during the second portion of the first clock cycle.

12. The method of claim 11, further comprising:

during the first portion of the first clock cycle, enabling the second sense amplifier for the second read operation while the first sense amplifier performs the first read operation; and during the second portion of the first clock cycle, not performing enable operations that include enabling the second sense amplifier.

13. The method of claim 11, further comprising:

during the first portion of the first clock cycle, not resetting the first sense amplifier; and during the second portion of the first clock cycle, resetting the first sense amplifier while the second sense amplifier performs the second read operation.

14. The method of claim 11, further comprising, during a portion of a second clock cycle, performing a write operation via a third sense amplifier including changing the state of the memory cell via the single port.

15. The method of claim 14, further comprising via one of the first sense amplifier and the second sense amplifier:

during the portion of the second clock cycle, not performing a read operation that includes sensing the state of the memory cell via the single port; and during another portion of the second clock cycle, performing a third read operation including sensing the state of the memory cell via the single port.

16. The method of claim 11, further comprising:

connecting the first sense amplifier to the single port during the first portion of the first clock cycle; and connecting the second sense amplifier to the single port during the second portion of the first clock cycle.

17. The method of claim 16, further comprising:

not connecting the second sense amplifier to the single port during the first portion of the first dock cycle; and disconnecting the first sense amplifier from the single port during the second portion of the first clock cycle.

18. The method of claim 11, further comprising:

connecting the first sense amplifier to the single port during the first portion of the first clock cycle;

connecting the second sense amplifier to the single port during the second portion of the first clock cycle;

during a first portion of a second clock cycle, connecting a third sense amplifier to the single port; and during a second portion of the second clock cycle, performing a write operation via the third sense amplifier including changing the state of the memory cell via the single port.

19. The method of claim 11, further comprising performing consecutive read operations during a second clock cycle via the first sense amplifier.

20. The method of claim 11, further comprising:

generating a first read pulse to perform the first read operation, the first read pulse is triggered by a rising edge of the first clock cycle; and generating a second read pulse to perform the second read operation, the second read pulse is triggered by a falling edge of the first read pulse.

* * * * *